United States Patent
Herr

(10) Patent No.: US 6,355,750 B1
(45) Date of Patent: *Mar. 12, 2002

(54) DYE ATTACH ADHESIVES FOR USE IN MICROELECTRONIC DEVICES

(75) Inventor: Donald E. Herr, Flemington, NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/549,639

(22) Filed: Apr. 14, 2000

Related U.S. Application Data

(63) Continuation-in-part of application No. 09/336,245, filed on Jun. 18, 1999, now Pat. No. 6,265,530.
(60) Provisional application No. 60/091,492, filed on Jul. 2, 1998.

(51) Int. Cl.$^7$ .................. C08J 122/40; C08G 73/12
(52) U.S. Cl. .................. 526/262; 528/322; 528/117; 528/172; 528/211; 528/253; 522/103; 526/279; 525/182
(58) Field of Search ............ 528/322, 117, 528/211, 172, 253; 522/103; 526/262, 279; 525/182

(56) References Cited

U.S. PATENT DOCUMENTS

| | | | | |
|---|---|---|---|---|
| 3,403,172 A | | 9/1968 | Jordan et al. ............. | 260/404.5 |
| 4,370,467 A | * | 1/1983 | Gaku et al. ................. | 528/322 |
| 4,540,650 A | | 9/1985 | Klug et al. ................. | 430/281 |
| 4,581,461 A | * | 4/1986 | Rossi et al. ................. | 548/406 |
| 4,806,608 A | * | 2/1989 | Klemarzchyk et al. ..... | 526/262 |
| 4,886,842 A | * | 12/1989 | Drain et al. ................. | 522/103 |

FOREIGN PATENT DOCUMENTS

| | | | | |
|---|---|---|---|---|
| EP | 0 028 994 A2 | 5/1981 | ........... | H01L/23/28 |
| JP | 10168413 | 6/1998 | ............... | C09J/9/02 |

* cited by examiner

*Primary Examiner*—David W. Wu
*Assistant Examiner*—Tanya Zalukaeva
(74) *Attorney, Agent, or Firm*—Jane E. Gennaro

(57) ABSTRACT

A thermoplastic or thermosetting adhesive for bonding an electronic component to a substrate in which the adhesive is cured in situ from a curable composition comprises one or more poly- or mono-functional maleimide compounds, or one or more poly- or mono-functional vinyl compounds other than maleimide compounds, or a combination of maleimide and vinyl compounds, a curing initiator and optionally, one or more fillers.

4 Claims, No Drawings

DYE ATTACH ADHESIVES FOR USE IN MICROELECTRONIC DEVICES

This application is a continuation-in-part of application Ser. No. 09/336,245, filed Jun. 18, 1999, now U.S. Pat. No. 6,265,530, which claims benefit of Prov. No. 60/091,492 filed Jul. 2, 1998.

FIELD OF THE INVENTION

This invention relates to compositions that are suitable for use as adhesives in microelectronic devices or semiconductor packages.

BACKGROUND OF THE INVENTION

Adhesive compositions, particularly conductive adhesives, are used for a variety of purposes in the fabrication and assembly of semiconductor packages and microelectronic devices. The more prominent uses are the bonding of integrated circuit chips to lead frames or other substrates, and the bonding of circuit packages or assemblies to printed wire boards.

The requirements for conductive adhesives in electronic packaging are that they have good mechanical strength, curing properties that do not affect the component or the carrier, and thixotropic properties compatible with existing application equipment currently used in the industry.

Another important aspect of an adhesive bonding or interconnection technology is the ability to rework the bond. For single chip packaging involving high volume commodity products, a failed chip can be discarded without significant loss. However, it becomes expensive to discard multi-chip packages with only one failed chip; consequently, the ability to rework the failed chip would be a manufacturing advantage. Today, one of the primary thrusts within the semiconductor industry is to develop adhesives that will meet all the requirements for adhesive strength and flexibility, but that will also be reworkable, that is, will be capable of being removed without destroying the substrate.

SUMMARY OF THE INVENTION

This invention is an adhesive composition for use in electronic devices that comprises one or more mono- or polyfunctional maleimide compounds, or one or more mono- or polyfunctional vinyl compounds other than maleimide compounds, or a combination of maleimide and vinyl compounds, a curing initiator, and optionally, one or more fillers. The composition can be designed to be reworkable.

In another embodiment, this invention is the cured adhesive that results from the just described curable adhesive composition.

In another embodiment, this invention is a microelectronic assembly comprising an electronic component bonded to a substrate with a cured adhesive composition prepared from a composition comprising one or more mono- or polyfunctional maleimide compounds, or one or more mono- or polyfunctional vinyl compounds, or a combination of maleimide and vinyl compounds, a curing initiator, and optionally one or more fillers.

DETAILED DESCRIPTION OF THE INVENTION

The maleimide and vinyl compounds used in the adhesive compositions of this invention are curable compounds, meaning that they are capable of polymerization, with or without crosslinking. As used in this specification, to cure will mean to polymerize, with or without crosslinking. Cross-linking, as is understood in the art, is the attachment of two polymer chains by bridges of an element, a molecular group, or a compound, and in general will take place upon heating. As cross-linking density is increased, the properties of a material can be changed from thermoplastic to thermosetting.

It is possible to prepare polymers of a wide range of cross-link density by the judicious choice and amount of mono- or polyfunctional compounds. The greater proportion of polyfunctional compounds reacted, the greater the cross-link density. If thermoplastic properties are desired, the adhesive compositions can be prepared from monofunctional compounds to limit the cross-link density. A minor amount of poly-functional compounds can be added to provide some cross-linking and strength to the composition, provided the amount of poly-functional compounds is limited to an amount that does not diminish the desired thermoplastic properties. Within these parameters, the strength and elasticity of individual adhesives can be tailored to a particular end-use application.

In those cases where it is necessary to rework the assembly and thermoplastic materials are used, the electronic component can be pried off the substrate, and any residue adhesive can be heated until it softens and is easily removed.

The cross-link density can also be controlled to give a wide range of glass transition temperatures in the cured adhesive to withstand subsequent processing and operation temperatures.

In the inventive adhesive compositions, the maleimide compounds and the vinyl compounds may be used independently, or in combination. The maleimide or vinyl compounds, or both, will be present in the curable package adhesive compositions in an amount from 2 to 98 weight percent based on the organic components present (excluding any fillers).

The adhesive compositions will further comprise at least one free-radical initiator, which is defined to be a chemical species that decomposes to a molecular fragment having one or more unpaired electrons, highly reactive and usually short-lived, which is capable of initiating a chemical reaction by means of a chain mechanism. The free-radical initiator will be present in an amount of 0.1 to 10 percent, preferably 0.1 to 3.0 percent, by weight of the organic compounds (excluding any filler). The free radical curing mechanism gives a fast cure and provides the composition with a long shelf life before cure. Preferred free-radical initiators include peroxides, such as butyl peroctoates and dicumyl peroxide, and azo compounds, such as 2,2'-azobis (2-methyl-propanenitrile) and 2,2'-azobis(2-methyl-butanenitrile).

Alternatively, the adhesive compositions may contain a photoinitiator in lieu of the free-radical initiator, and the curing process may then be initiated by UV radiation. The photoinitiator will be present in an amount of 0.1 to 10 percent, preferably 1 to 5.0 percent, by weight of the organic compounds (excluding any filler). In some cases, both photoinitiation and thermal initiation may be desirable. For example, the curing process can be started by UV irradiation, and in a later processing step, curing can be completed by the application of heat to accomplish a free-radical cure.

In general, these compositions will cure within a temperature range of 80–200° C., and curing will be effected within a length of time of less than 1 minute to 60 minutes. As will be understood, the time and temperature curing profile for each adhesive composition will vary, and different compositions can be designed to provide the curing profile that will be suited to the particular industrial manufacturing process.

Suitable conductive fillers for the adhesives are silver, copper, gold, palladium, platinum. In some circumstances, nonconductive fillers may be needed, for example to adjust rheology, such as, alumina, silica, and teflon.

As used throughout this specification, the notation C(O) refers to a carbonyl group.

Maleimide Compounds

The maleimide compounds suitable for use in the adhesive compositions of this invention have a structure represented by the formula: $[M—X_m]_n—Q$, or by the formula: $[M—Z_m]_n—K$. For these specific formulae, when lower case "n" is the integer 1, the compound will be a mono-functional compound; and when lower case "n" is an integer 2 to 6, the compound will be a poly-functional compound.

$[M—X_m]_n—Q$, or by the formula: $[M—Z_m]_n—K$.

Formula $[M—X_m]_n—Q$ represents those compounds in which:

M is a maleimide moiety having the structure

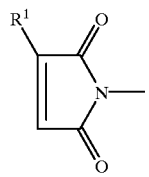

in which $R^1$ is H or $C_1$ to $C_5$ alkyl;

each X independently is an aromatic group selected from the aromatic groups having the structures (I) through (IV):

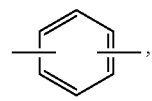
(I)

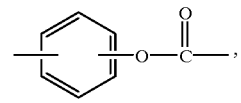
(II)

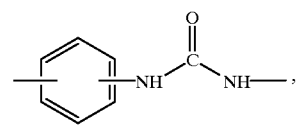
(III)

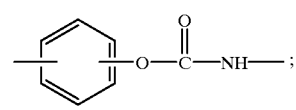
(IV)

Q is a linear or branched chain alkyl, alkyloxy, alkylene, alkyleneoxy, aryl, or aryloxy alkyl amine, alkyl sulfide, alkylene amine, alkylene sulfide, aryl sulfide species, which may contain saturated or unsaturated cyclic or heterocyclic substituents pendant from the chain or as part of the backbone in the chain, and in which any heteroatom present may or may not be directly attached to X;

or Q is a urethane having the structure:

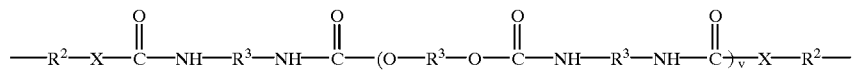

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50;

or Q is an ester having the structure:

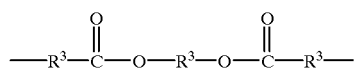

in which $R^3$ is an alkyl or alkyloxy chain having up to 100 atoms in the chain, which chain may contain aryl substituents;

or Q is a siloxane having the structure:

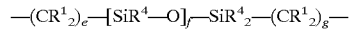

in which the $R^1$ substituent independently for each position is H or an alkyl group having 1 to 5 carbon atoms and the $R^4$ substituent independently for each position is H, an alkyl group having 1 to 5 carbon atoms or an aryl group, and e and g are independently 1 to 10 and f is 1 to 50; and m is 0 or 1, and n is 1 to 6.

Preferred compositions are aliphatic bismaleimides in which the maleimide funtionality is linked to the backbone through urethane or urea linkages, such as in the following preferred compounds:

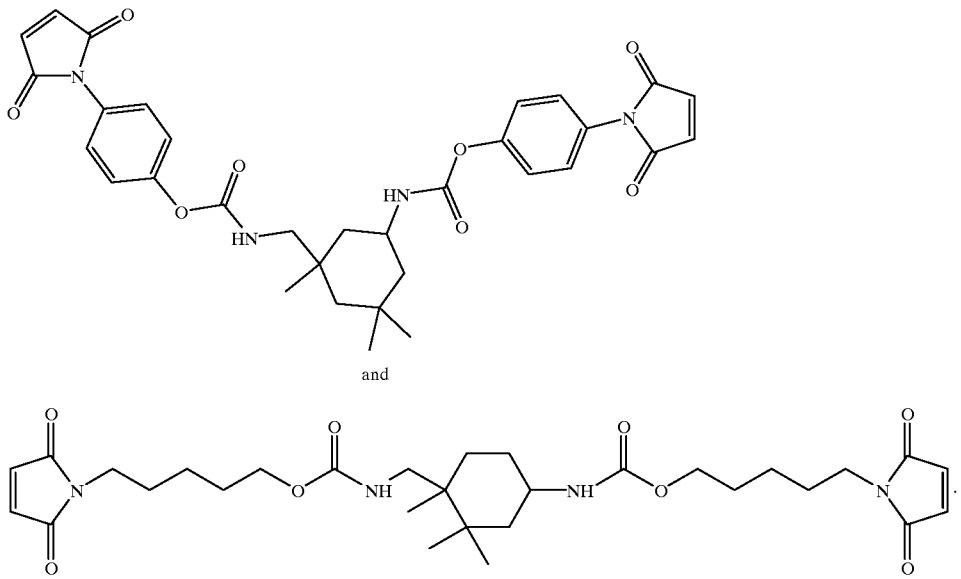

and

Formula [M—$Z_m$]$_n$—K represents those compounds in which

M is a maleimide moiety having the structure

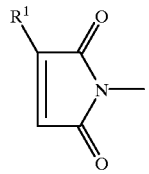

in which $R^1$ is H or $C_1$ to $C_5$ alkyl;

Z is a linear or branched chain alkyl, alkyloxy, alkyl amine, alkyl sulfide, alkylene, alkyleneoxy, alkylene amine, alkylene sulfide, aryl, aryloxy, or aryl sulfide species, which may contain saturated or unsaturated cyclic or heterocyclic substituents pendant from the chain or as part of the backbone in the chain, and in which any heteroatom present may or may not be directly attached to K;

or Z is a urethane having the structure:

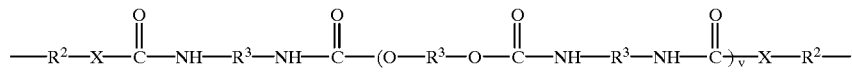

in which each $R^2$ independently is an alkyl, aryl, or arylalkyl group having 1 to 18 carbon atoms, and $R^3$ is an alkyl or alkyloxy chain having up to 100 atoms in the chain, which chain may contain aryl substituents, and v is 0 to 50;

or Z is a siloxane having the structure:

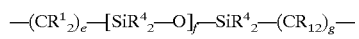

in which the $R^1$ substituent independently for each position is H or an alkyl group having 1 to 5 carbon atoms and the $R^4$ substituent independently for each position is H, an alkyl group having 1 to 5 carbon atoms or an aryl group, and a and g are independently 1 to 10 and f is 1 to 50;

K is an aromatic group selected from the aromatic groups having the structures (VI) through (XIII) (although only one bond may be shown to represent connection to the aromatic group K, this will be deemed to represent any number of additional bonds as described and defined by n):

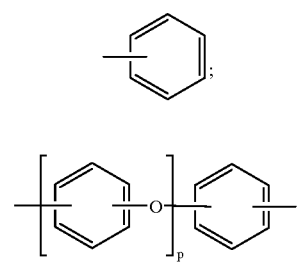
(V)

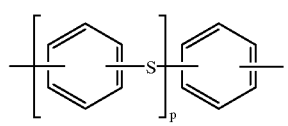
(VI)

in which p is 1 to 100;

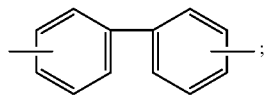
(VII)

in which p is 1 to 100;

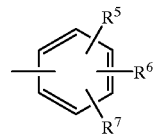
(VIII)

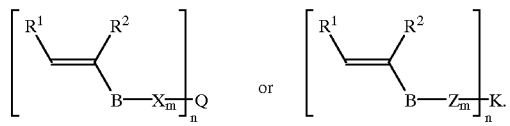
(IX)

in which $R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species, which may contain saturated or unsaturated cyclic or heterocyclic substituents pendant from the chain or as part of the backbone in the chain, and in which any heteroatom present may or may not be directly attached to the aromatic ring; or $R^5$, $R^6$, and $R^7$ are a siloxane having the structure —$(CR^1{}_2)_e$—[$SiR^4{}_2$—O]$_f$—$SiR^4{}_2$—$(CH_3)_g$— in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 1 to 50;

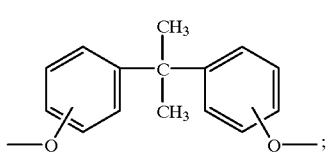
(X)

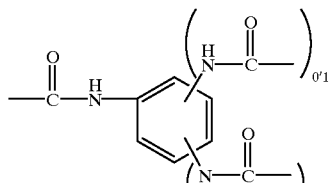
(XI)

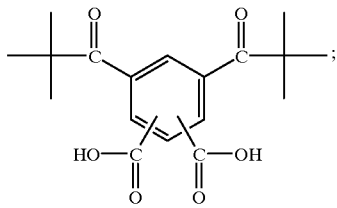
(XII)

and m is 0 or 1, and n is 1 to 6.

Preferred maleimide compounds, particularly for reworkable compositions, are N-butylphenyl maleimide and N-ethylphenyl maleimide.

Vinyl Compounds

The vinyl compounds (other than the maleimides herein) suitable for use in the adhesive compositions of this invention will have the structure:

$$\left[ \begin{array}{c} R^1 \quad R^2 \\ \diagup \\ B-X_{\overline{m}} \end{array} \right]_n Q \quad \text{or} \quad \left[ \begin{array}{c} R^1 \quad R^2 \\ \diagup \\ B-Z_{\overline{m}} \end{array} \right]_n K.$$

For these specific structures, when lower case "n" is the integer 1, the compound will be a mono-functional compound; and when lower case "n" is an integer 2 to 6, the compound will be a poly-functional compound.

In these structures, $R^1$ and $R^2$ are H or an alkyl having 1 to 5 carbon atoms, or together form a 5 to 9 membered ring with the carbons forming the vinyl group; B is C, S, N, O, C(O), O—C(O), C(O)—O, C(O)NH or C(O)N($R^8$), in which $R^8$ is $C_1$ to $C_5$ alkyl; m is 0 or 1; n is 1–6; and X, Q, Z, and K are as described above.

Preferably, B is O, C(O), C(O)—O, C(O)NH or C(O)N($R^8$); more preferably B is O, C(O), O—C(O), C(O)—O, or C(O)N($R^8$).

The preferred vinyl compounds for use as adhesives are vinyl ethers or alkenyl sufides. Examples of suitable vinyl compounds are the following:

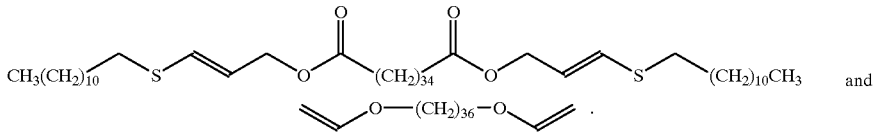

Other Composition Components

Depending on the nature of the substrate to which the adhesive is to be bonded, the adhesive may also contain a coupling agent. A coupling agent as used herein is a chemical species containing a polymerizable functional group for reaction with the maleimide and other vinyl compound, and a functional group capable of condensing with metal hydroxides present on the surface of the substrate. Such coupling agents and the preferred amounts for use in compositions for particular substrates are known in the art. Suitable coupling agents are silanes, silicate esters, metal acrylates or methacrylates, titanates, and compounds containing a chelating ligand, such as phosphine, mercaptan, and acetoacetate. When present, coupling agents typically will be in amounts up to 10 percent by weight, and preferably in amounts of 0.1–3.0 percent by weight, of the maleimide and other monofunctional vinyl compound.

In addition, the adhesive compositions may contain compounds that lend additional flexibility and toughness to the resultant cured adhesive. Such compounds may be any thermoset or thermoplastic material having a Tg of 50° C. or less, and typically will be a polymeric material characterized by free rotation about the chemical bonds, the presence of ether groups, and the absence of ring structures. Suitable such modifiers include polyacrylates, poly(butadiene), poly-THF (polymerized tetrahydrofuran), CTBN (carboxy-terminated butadiene-acrylonitrile) rubber, and polypropylene glycol. When present, toughening compounds may be in an amount up to about 15 percent by weight of the maleimide and other monofunctional vinyl compound.

If siloxane moieties are not part of the maleimide or vinyl compound structure, siloxanes can be added to the package formulations to impart elastomeric properties. Suitable siloxanes are the methacryloxypropyl-terminated polydimethyl siloxanes, and the aminopropyl-terminated polydimethylsiloxanes, available from United Chemical Technologies and others.

Other additives, such as adhesion promoters, in types and amounts known in the art, may also be added.

Performance Properties

These compositions will perform within the commercially acceptable range for die attach adhesives. Commerically acceptable values for die shear for the adhesives on a 80×80 mil$^2$ silicon die are in the range of greater than or equal to 1 kg at room temperature, and greater than or equal to 0.5 kg at 240° C., and for warpage for a 500×500 mil$^2$ die are in the range of less than or equal to 70 $\mu$m at room temperature.

The coefficient of thermal expansion (CTE) is the change in dimension per unit change in temperature for a given material. Different materials will have different rates of expansion. If the CTE is very different for elements attached together, thermal cycling can cause the attached elements to bend, crack, or delaminate. In a typical semiconductor assembly, the CTE of the chip is in the range of 2 or 3 ppm/° C.; for organic circuit board substrate, the CTE is greater than 30 ppm/° C.; therefore, the CTE of the adhesive is best between that of the substrate and die.

When a polymer is subjected to the application of heat, it will move through a transition region between a hard, glassy state to a soft, rubbery state. This region is known as the glass transition region or Tg. If a graph of expansion of the polymer versus temperature is plotted, the glass transition region is the intersection between the lower temperature/glassy region coefficient of thermal expansion and the higher temperature/rubbery region coefficient of thermal expansion. Above this region, the rate of expansion increases significantly. Consequently, it is preferred that the glass transition of the polymer be higher than normal operating temperatures experienced during the application, and if reworkability is needed, that the glass transition be lower than any rework temperature.

Another embodiment of this invention includes the maleimides having the formulae $[M—X_m]_n—Q$ and $[M—Z_m]_n—K$ as described herein in which Q and Z can be an ester having the structure

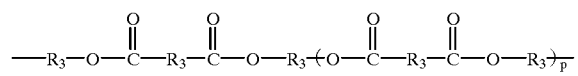

or the structure

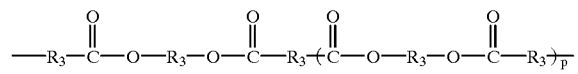

in which p is 1 to 100, each $R^3$ can independently be an alkyl or alkyloxy chain having up to 100 atoms in the chain, which chain may contain aryl substituents, or a siloxane having the structure $—(CR^1{}_2)_e—[SiR^4{}_2—O]_f—SiR^4{}_2—CR^1{}_2)_g—$ in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10 and f is 1 to 50.

Another embodiment of this invention includes the vinyl compounds having the structures

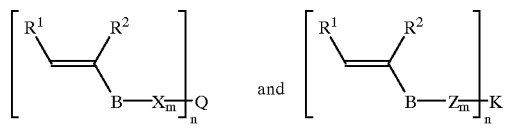

as described herein in which B is C, S, N, O, C(O), C(O)NH or C(O)N($R^8$), in which $R^8$ is $C_1$ to $C_5$ alkyl.

Another embodiment of this invention includes the vinyl compounds having the structures

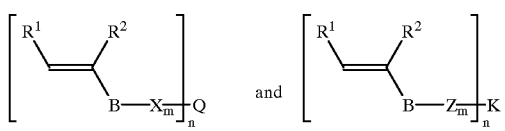

as described herein in which Q and Z can be an ester having the structure

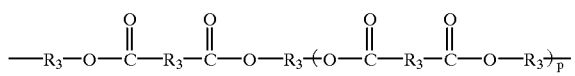

or the structure

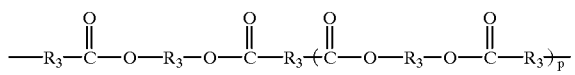

in which p is 1 to 100,
each $R^3$ can independently be an alkyl or alkyloxy chain having up to 100 atoms in the chain, which chain may contain aryl substituents,
or a siloxane having the structure $$-(CR^1{}_2)_e-[SiR^4{}_2-O]_f-SiR^4{}_2-(CR^1{}_2)_g-$$

in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50.

Another embodiment of this invention includes the curable adhesive composition as described herein containing an anionic or cationic curing initiator. The types and useful amounts of such initiators are well known in the art.

EXAMPLES

Various maleimide and vinyl compounds were prepared and formulated into adhesive compositions. The compositions were investigated for viscosity and thixotropic index for the uncured composition, and for curing profile, glass transition temperature, coefficient of thermal expansion, thermal mechanical analysis, and in some cases reworkability for the cured composition.

Example 1.

Preparation of Butadiene-Acrylonitrile Bismaleimide

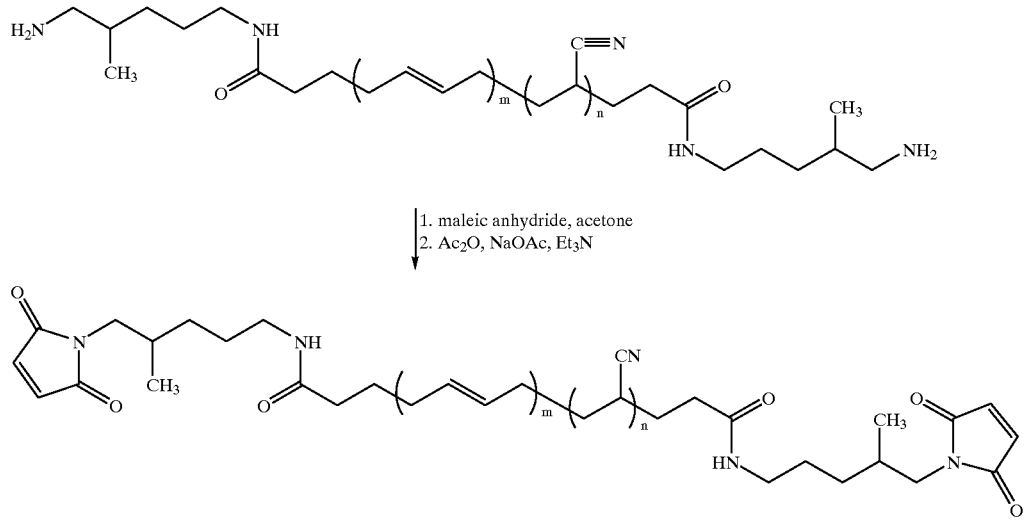

Amino-terminated butadiene-acrylonitrile (sold as Hycar resin 1300 X42 ATBN by BF Goodrich, in which the m and n depicted in the structure are integers to provide a number average molecular weight of 3600) (450 g, 500 mmol based on amine equivalent weight AEW=450 g) was dissolved in $CHCl_3$ (1000 mL) in a 3 L four-necked flask equipped with addition funnel, mechanical stirrer, internal temperature probe and nitrogen inlet/outlet. The stirred solution was placed under nitrogen and cooled on an ice bath. The addition funnel was charged with maleic anhydride (98.1 g, 1 mol) in $CHCl_3$ (50 mL) and this solution was added to the reaction over 30 minutes, maintaining the internal reaction temperature below 10° C. This mixture was stirred for 30 minutes on ice, then allowed to warm to room temperature and stirred for an additional 4 hours. To the resulting slurry was added acetic anhydride ($Ac_2O$) (653.4 g, 6 mol), tri ethylamine (Et₃N) (64.8 g, 0.64 mol) and sodium acetate (NaOAc) (62.3 g, 0.76 mol). The reaction was heated to mild reflux for 5 hours, allowed to cool to room temperature, and subsequently extracted with H₂O (1 L), satd. NaHCO₃ (1 L) and H₂O (2×1 L). Solvent was removed in vacuo to yield the maleimide terminated butadiene acrylonitrile.

Example 2

Preparation of Tris(maleimide) Derived From Tris(epoxypropyl)isocyanurate

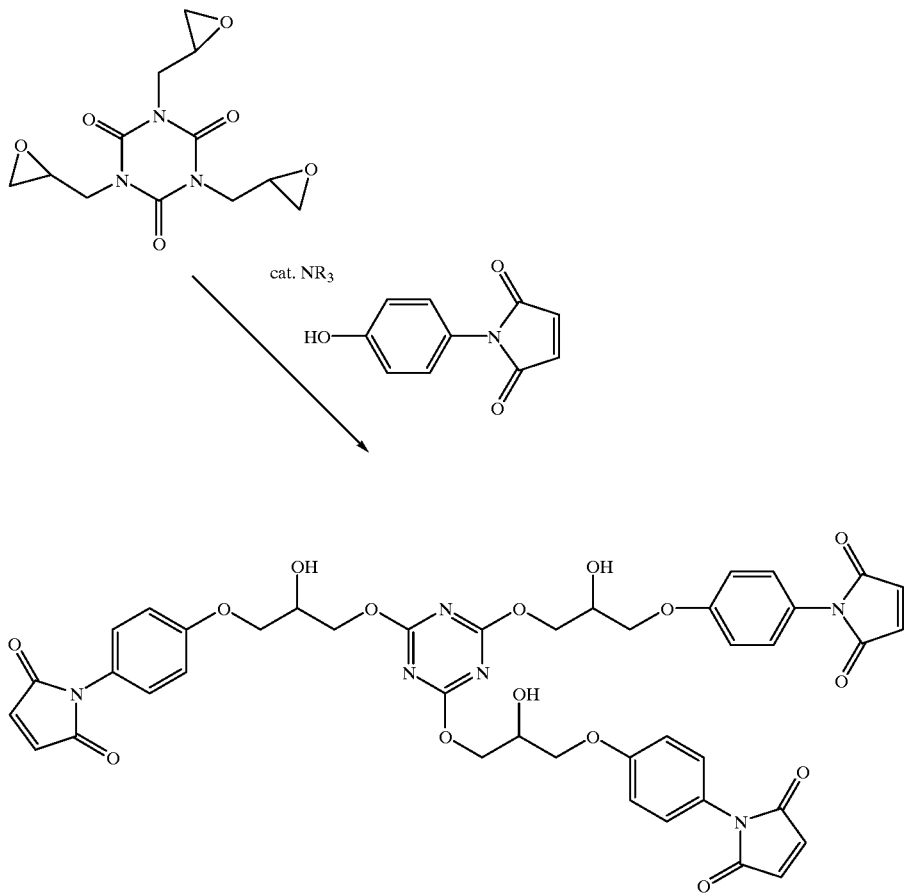

Tris(epoxypropyl)isocyanurate (99.0 g, 0.33 mol) is dissolved in THF (500 mL) in a 2 L three-necked flask equipped with mechanical stirrer, internal temperature probe and nitrogen inlet/outlet. To this solution is added hyroxyphenylmaleimide (189.2 g, 1 mol) and benzyldimethylamine (1.4 g, 0.05 wt. %). The solution is heated to 80° C. for 7 hours. The reaction then is allowed to cool to room temperature, is filtered, and the filtrant washed with 5% $HCl_{aq}$ (500 mL) and distilled H₂O (1 L). The resulting solid, triazinetris(maleimide), is vacuum dried at room temperature.

Example 3

Preparation of Maleimidoethylpalmitate

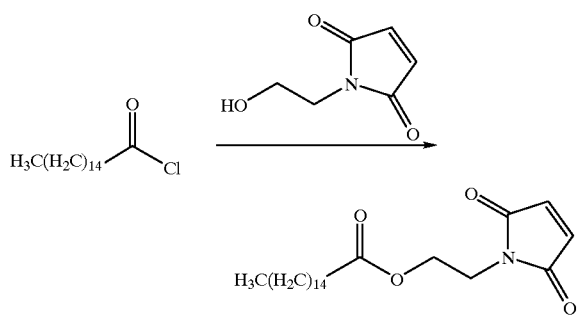

Palmitoyl chloride (274.9 g, 1 mol) is dissolved in Et$_2$O (500 mL) in a 2 L three-necked flask equipped with mechanical stirrer, internal temperature probe, addition funnel and nitrogen inlet/outlet. NaHCO$_3$ (84.0 g, 1 mol) in distilled H$_2$O (500 mL) is added with vigorous stirring and the solution cooled on an ice bath under nitrogen. The addition funnel is charged with hydroxyethylmaleimide (141 g, 1 mol) in Et$_2$O (100 mL) and this solution added to the reaction over a period of 30 minutes, maintaining an internal T<10° C. during the addition. The reaction is stirred for another 30 minutes on ice, then allowed to warm to room temperature and stirred for 4 hours. The reaction is transferred to a separatory funnel and the isolated organic layer washed with distilled H$_2$O (500 mL), 5% HCl$_{aq}$ (500 mL) and distilled H$_2$O (2×500 mL). The organics are isolated, dried over MgSO$_4$ anhyd., filtered and solvent removed in vacuo to yield the aliphatic maleimide.

Example 4

Preparation of Bismaleimide Derived from
5-lsocyanato-1-(isocyanatomethyl)-
1, 3, 3-trimethylcyclohexane

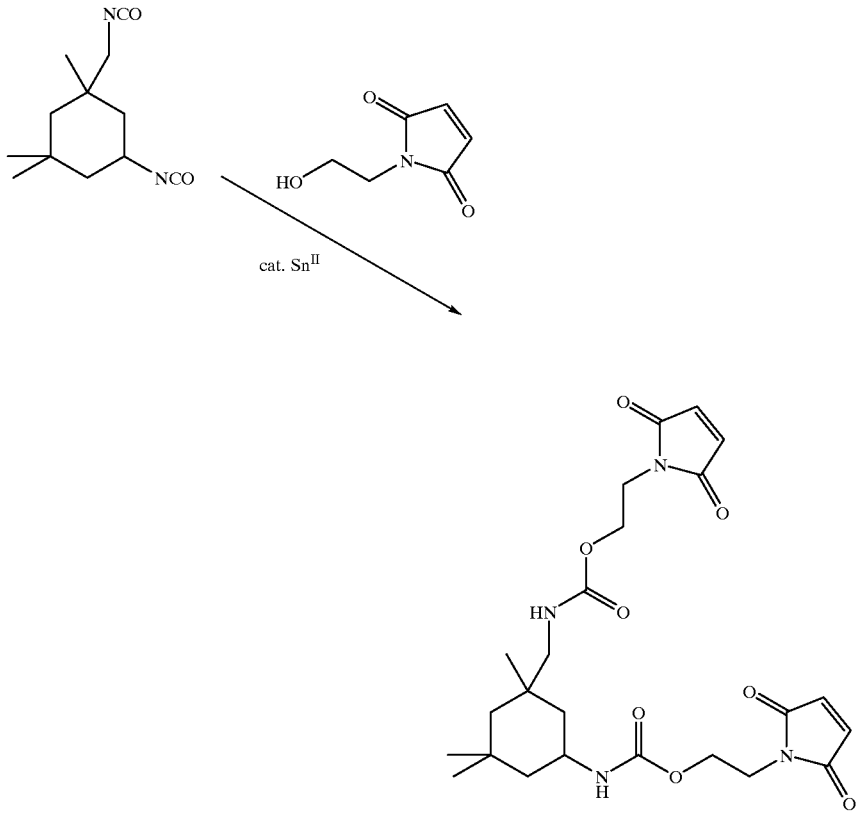

5-Isocyanato-1-(isocyanatomethyl)-1,3,3-trimethylcyclohexane 111.15 g, 0.5 mol) is solvated in THF (500 mL) in a 1 L three-necked flask equipped with mechanical stirrer, addition funnel and nitrogen inlet/outlet. The reaction is placed under nitrogen, and dibutyltin dilaurate (cat. Sn") (6.31 g, 10 mmol) and hydroxyethylmaleimide (141 g, 1 mol) are added with stirring, and the resulting mixture heated for four hours at 70° C. The addition funnel is charged with hydroxyethylmaleimide (141 g, 1 mol) dissolved in THF (100 mL). This solution is added to the isocyanate solution over 30 minutes, and the resulting mixture heated for an additional 4 hours at 70° C. The reaction is allowed to cool to room temperature and solvent removed in vacuo. The remaining oil is dissolved in CH$_2$Cl$_2$ (1 L) and washed with 10% HCl$_{aq}$ (1 L) and distilled H$_2$O (2×1 L). The isolated organics are dried over MgSO$_4$, filtered and the solvent removed in vacuo to yield the maleimide.

Example 5

Preparation of Dimer Divinyl Ether Derived From Pripol 2033

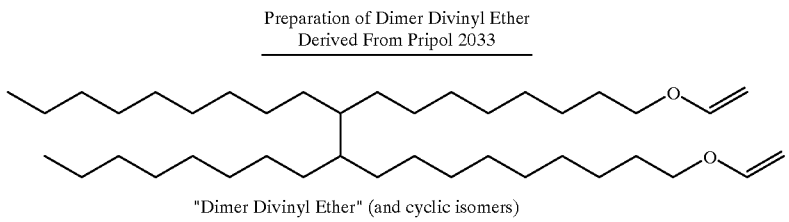

"Dimer Divinyl Ether" (and cyclic isomers)

Bis(1, 10-phenanthroline)Pd(OAc)$_2$ (0.21 g, 0.54 mmol) was dissolved in a mixture of butyl vinyl ether (8.18 g, 81.7 mmols), heptane (100 mL) and "dimer diol" (sold as Pripol 2033 by Unichema, 15.4 g, 27.2 mmol) in 2 L three-necked flask equipped with a mechanical stirrer under nitrogen. This solution was heated to light reflux for 6 h. The solution was allowed to cool to room temperature and subsequently poured onto activated carbon (20 g) and stirred for 1 hour. The resulting slurry was filtered, and excess butyl vinyl ether and heptane were removed in vacuo to yield the divinyl ether as a yellow oil. The product exhibited acceptable $^1$H NMR, FT-IR and $^{13}$C NMR spectral characteristics. Typical viscosity ~100 cPs.

Example 6

Preparation of Dimer Diacrylate Derived From Dimer Diol (Pripol 2033)

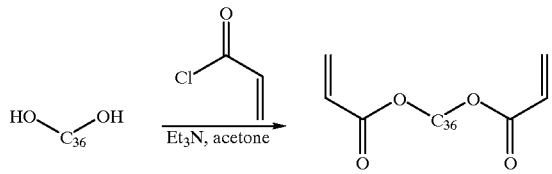

A dimer diol (sold as Pripol 2033 by Unichema, 284.4 g, 500 mmol) is dissolved in dry acetone (500 mL) in a 1 L three-necked flask equipped with mechanical stirrer, addition funnel and internal temperature probe under nitrogen. Triethylamine (101.2 g, 1 mol) is added to this solution and the solution cooled to 4° C. on an ice bath. Acryloyl chloride (90.5 g, 1 mol) solvated in dry acetone (100 mL) is charged into the addition funnel and added to the stirred reaction solution over the course of 60 minutes, maintaining an internal temperature <10° C. This solution is stirred on ice for an additional 2 hours, then allowed to warm to room temperature and stirred for 4 hours. Bulk solvent is removed via a rotary evaporator, and the remaining residue solvated in CH$_2$Cl$_2$ (1 L). This solution is washed with 5% HCl$_{aq}$ (800 mL), and H$_2$O (2×800 mL). The isolated organics are dried over MgSO$_4$ anhyd. and filtered, and the solvent removed in vacuo to yield the diacrylate as an oil.

Example 7

Preparation of N-ethylphenyl Maleimide

4-Ethyl aniline (12.12 g) was dissolved in 50 ml of anhydrous ethyl ether and slowly added to a stirred solution of 9.81 g of maleic anhydride in 100 ml of anhydrous ethyl ether chilled in an ice bath. After completion of the addition, the reaction mixture was stirred for 30 minutes. The light yellow crystals were filtered and dried. Acetic anhydride (200 ml) was used to dissolve the maleamic acid and 20 g of sodium acetate. The reaction mixture was heated in an oil bath at 160° C. After 3 hours of reflux, the solution was cooled to room temperature, placed in a 1 L beaker in ice water and stirred vigorously for 1 hour. The product was suction-filtered and recrystallized in hexane. The collected crystalline material was dried at 50° C. in a vacuum oven overnight. FTIR and NMR analysis showed the characteristics of ethyl maleimide.

Example 8

Preparation a Bis(alkenylsulfide)

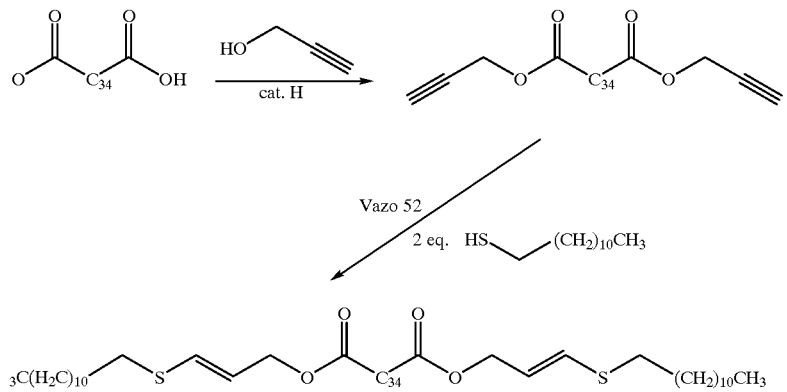

Dimer acid (sold under the trademark Empol 1024 by Unichema) (574.6 g, 1 mol) and propargyl alcohol (112.1 g, 2 mol) are solvated in toluene (1 L) in a 3 L three-necked flask equipped with mechanical stirring and a Dean-Stark distillation apparatus. Concentrated $H_2SO_4$ (6 mL) is added and the solution refluxed for 6 hours until 36 mL of $H_2O$ is azeotropically distilled. The solution is allowed to cool to room temperature, is washed with $H_2O$ (2×1 L), dried over $MgSO_4$ anhyd. and the solvent removed in vacuo to yield the propargyl ester intermediate as an oil.

This ester intermediate (650.7 g, 1 mol) is solvated in THF (200 mL) in a 1 L three-necked flask equipped with reflux condensor, mechanical stirrer and internal temperature probe under nitrogen. Lauryl mercaptan (404.8 g, 2 mol) and 2,2'-azobis(2,4-dimethylpentanenitrile) (sold under the trademark Vazo 52 by DuPont) (11 g) are added and the resulting mixture heated to 70° C. on an oil bath with stirring for 7 hours. The reaction is allowed to cool to room temperature and solvent removed in vacuo to yield the alkenyl sulfide as an oil.

Example A

Preparation of 6-maleimidocaproic acid

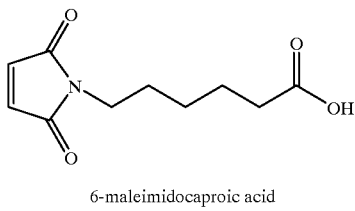

6-maleimidocaproic acid

The acid functional maleimide, 6-maleimidocaproic acid, was synthesized using known methodology.[1] Aminocaproic acid (100 g, $7.6 \times 10^{-1}$ mols) was dissolved in glacial acetic acid (50 mL) in a 500 mL four-necked flask equipped with mechanical stirring, an internal temperature probe and an addition funnel. The addition funnel was charged with a solution of maleic anhydride (74.8 g, $7.6 \times 10^{-1}$ mols) dissolved in acetonitrile (75 mL). This solution was added to the aminocaproic acid at room temperature dropwise over 1 hour, maintaining an internal reaction temperature less than 35° C. The reaction was stirred for three hours after the addition was complete. The reaction slurry was filtered, and the isolated filtrate was dried in a vacuum oven (P~25 T) overnight at 70° C. to yield 166 g of off white solid (95%). The product amic acid exhibited FT-IR and $^1$H NMR spectral characteristics consistent with literature data.

The amic acid described above (166 g, $7.2 \times 10^{-1}$ mols) was solvated in a solution of toluene (200 mL), benzene (200 mL) and triethylamine (211 mL, 1.51 mol) in a 1 L three-necked flask equipped with mechanical stirring and a Dean-Stark trap under nitrogen. This solution was heated to reflux for 4 h and the water produced collected in the Dean-Stark trap. Distilled water (400 mL) was added to the reaction flask to dissolve the triethylammonium salt of the product which largely separated from the bulk solution during the reaction. This aqueous layer was isolated, acidified to pH~1 with 50% HCl, and extracted with ethyl acetate (600 mL). This organic layer was washed with distilled water (400 mL). The isolated organic layer was dried over $MgSO_4$, followed by solvent removal in vacuo to yield an off white solid (76.2 g, 50%). The product 6-maleimidocaproic acid was spectrographically identical to literature material by FT-IR and $^1$H NMR.

Example B

Preparation of "Dimer Diester Bismaleimide"

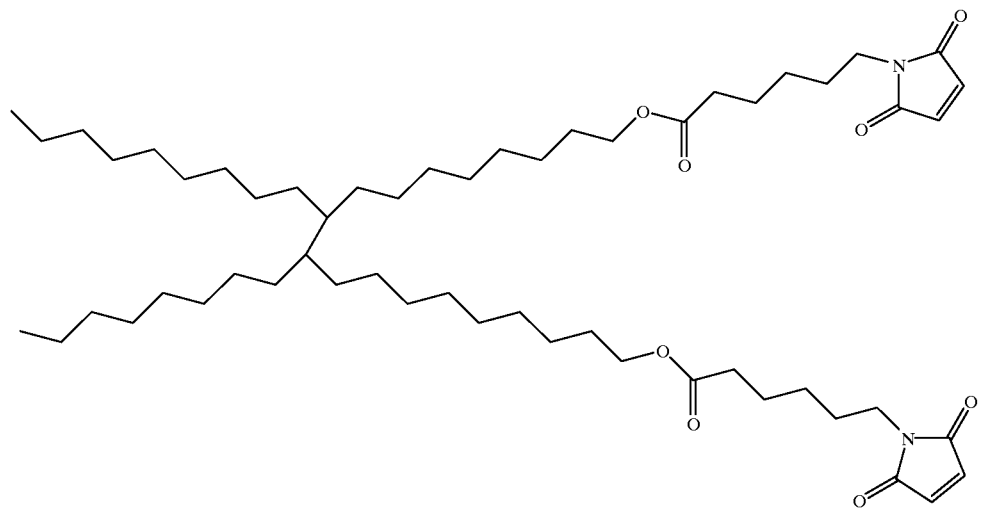

"Dimer Diester Bismaleimide"(and cyclic isomers)

Pripol 2033 ("dimer diol", Uniqema, 92.4 g, $1.69 \times 10^{-1}$ mols), 6-maleimidocaproic acid (75.0 g, $3.55 \times 10^{-1}$ mols) and $H_2SO_4$ (0.50 mL, $\sim 8.5 \times 10^{-3}$ mols) were slurried in toluene (300 mL) in a 1 L four-necked flask equipped with mechanical stirrer, a Dean-Stark trap and an internal temperature probe under nitrogen. The reaction was heated to light reflux for two hours and the water evolved collected in the Dean-Stark trap. The trap was drained and ~50 mL of toluene solvent was distilled off of the reaction to remove trace moisture and drive the esterification equilibrium to completion. The reaction was allowed to cool to room temperature, additional toluene (100 mL) was added (on the laboratory scale it is preferable to add diethyl ether in place of toluene at this point), and the solution was washed with saturated NaHCO$_3$ aq. (300 mL) and distilled water (300 mL). The organic layer was isolated and dried over anhydrous MgSO$_4$, and the solvent removed in vacuo to yield an orange oil (107.2 g, 68%). The material can be further purified by eluting a toluene solution of the resin through a short plug of silica or alumina. This liquid bismaleimide resin exhibited acceptable FT-IR, $^1$H NMR, and $^{13}$C NMR data. Typical η~2500 cPs.

Example C

Preparation of "Decane Diol Diester Bismaleimde

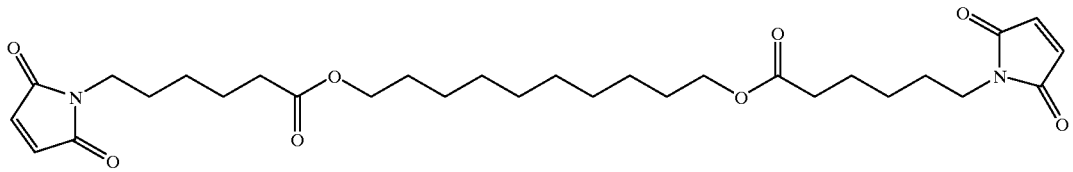

"Decane Diol Diester Bismaleimide"

The general procedure described in Example B, was applied substituting decane diol (29.5 g, 1.69×10$^{-1}$ mols) for Pripol 2033. This process yielded a solid, moderately soluble bismaleimide (54.9 g, 58%). The product exhibited satisfactory FT-IR and $^1$H NMR data.

Example D

Preparation of "Glycerol Triester Tris(maleimide)"

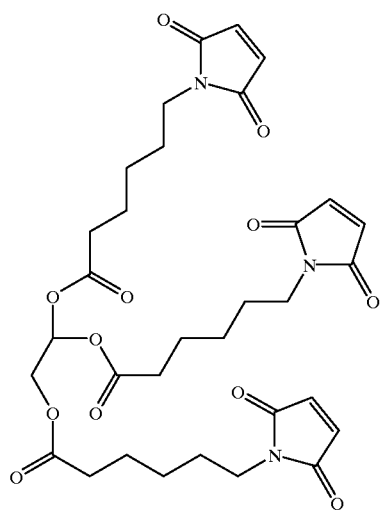

The protocol outlined in example B. was utilized substituting glycerol (10.4 g, 1.13×10$^{-1}$ mol) for Pripol 2033. The product was a viscous liquid which exhibited acceptable FT-IR and $^1$H NMR data.

Example E

Preparation of "Bis(m-nitrobenzyl carbamate) of IPDI"

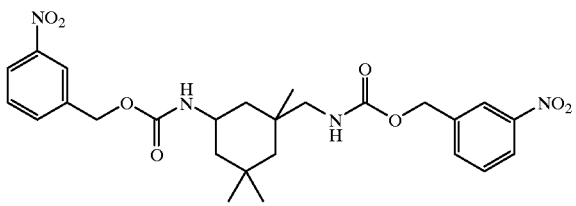

"Bis(m-nitrobenzyl carbamate) of IPDI"

Isophorone diisocyanate ("IPDI", 100.0 g, 4.5×10$^{-1}$ mols), m-nitrobenzyl alcohol (137.8 g, 9.0×10$^{-1}$ mols) and dibutyl tin dilaurate (2.8 g, 4.5×10$^{-3}$ mols) were solvated in dry toluene (1500 mL) in a 2L three-necked flask equipped with mechanical stirrer, reflux condensor and internal temperature probe under nitrogen. The resulting solution was heated to 90° C. for 4 h. No isocyanate band was observed in the IR of the solids portion of the sample. The solution was allowed to cool to room temperature and washed with distilled H$_2$O (100 mL). The organic layer was isolated and solvent removed in vacuo to yield a yellow liquid which exhibited acceptable FT-IR and $^1$H NMR characteristics.

Example F

Preparation of "Bis(m-aminobenzyl carbamate) of IPDI"

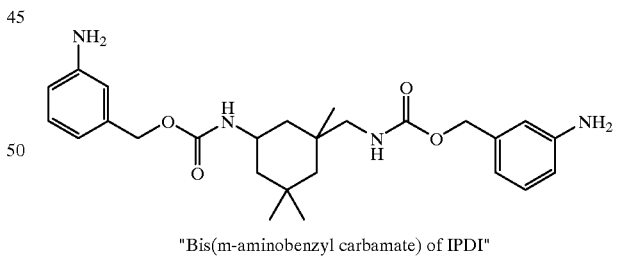

"Bis(m-aminobenzyl carbamate) of IPDI"

The dinitro compound from Example E. (8.28 g, 1.57×10$^{-2}$ mols) was dissolved in ethanol (100 mL) in a 500 mL three-necked round bottom flask equipped with magnetic stirring under nitrogen. Cyclohexene (28.6 mL, 2.82×10$^{-1}$ mols) was added, followed by 5% Pd/C (4.14 g). The resulting slurry was refluxed lightly for 6.5 h. The FT-IR of a filtered aliquot of this solution exhibited no nitro stretching bands at 1529 cm$^{-1}$ and 1352 cm$^{-1}$. The bulk solution was allowed to cool to room temperature and filtered. Solvent was removed in vacuo to yield a yellow semisolid (6.6 g, 90%) which exhibited acceptable FT-IR and $^1$H NMR spectral characteristics.

Example G

Preparation of "Bis(m-maleimidobenzyl carbamate) of IPDI"

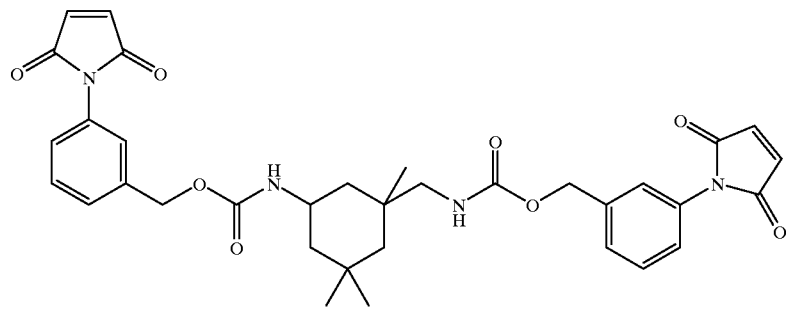

"Bis(m-maleimidobenzyl carbamate) of IPDI"

The diamine from Example F (6.6 g, 1.41×1$^{-2}$ mols) was solvated in acetone (60 mL) in a 250 mL four-necked flask equipped with magnetic stirrer and addition funnel under nitrogen and cooled to 4° C. Maleic anhydride (2.76 g, 2.82×10$^{-2}$ mols) dissloved in acetone (20 mL) was added over the course of 30 minutes. The resulting solution was stirred at 4° C. for for 1 h, and subsequently was allowed to warm to room temperature and stirred overnight. FT-IR analysis indicated no maleic anhydride remained as judged by the absence of the anhydride stretching band at ~1810 cm$^{-1}$.

To the above amic acid solution was added acetic anhydride (8.5 mL, 9.0×10$^{-2}$ mols), triethylamine (1.26 mL, 9.0×10$^{-1}$ mols) and sodium acetate (0.88 g, 1.1×10$^{-2}$ mols). The resulting solution was refluxed lightly for 4 h under nitrogen. The reaction was allowed to cool to room temperature and bulk solvent was removed in vacuo. The resulting viscous liquid was resolvated in methylene chloride (200 mL) and extracted with distilled water (3×200 mL). The organics were then dried over MgSO$_4$ anhyd., filtered and solvent removed in vacuo to yield a light brown solid (6.75 g, 76%). This material exhibited acceptable FT-IR and $^1$H NMR spectral features.

Example H

Preparation of "Bis(m-nitrobenzyl carbamate) of DDI 1410"

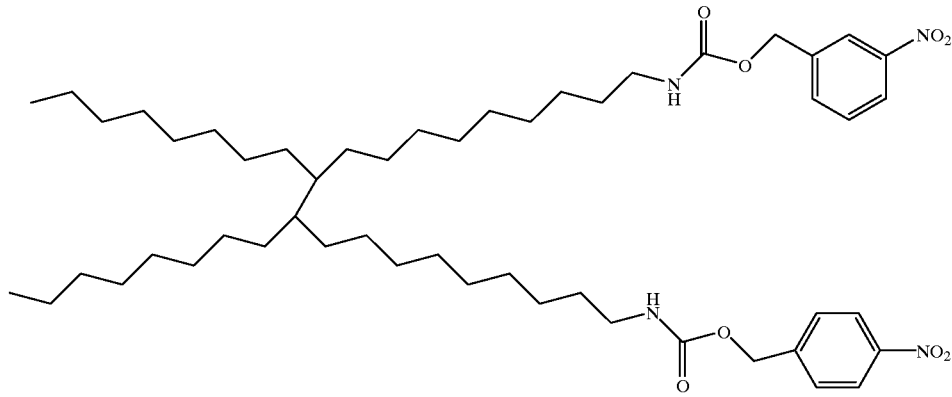

"Bis(m-nitrobenzyl carbamate) of DDI 1410" (and cyclic isomers)

DDI 1410 (Henkel, "Dimer Diisocyanate", 99.77 g, 1.65×10$^{-1}$ mols based on 13.96% NCO), m-nitrobenzyl alcohol (50.8 g, 3.32×10$^{-1}$ mols) and dibutyltin dilaurate (0.5 mL, 8.3×10$^{-4}$ mols) were solvated in toluene (150 mL) in a 1 L four-necked flask equipped with mechanical stirrer, reflux condensor and internal temperature probe under nitrogen. The reaction was heated to 85° C. for 2.5 h. FT-IR analysis of an aliquot of the reaction indicated complete comsumption of isocyanate functionality as judged by the lack of a band at 2272 cm$^{-1}$. Solvent was removed from the reaction in vacuo to yield a yellow oil which solidified upon standing at room temperature (152.4 g, 102% (trace toluene)). This solid exhibited satisfactory FT-IR and $^1$H NMR spectral features.

Example I

Preparation of "Bis(m-aminobenzyl carbamate) of DDI 1410"

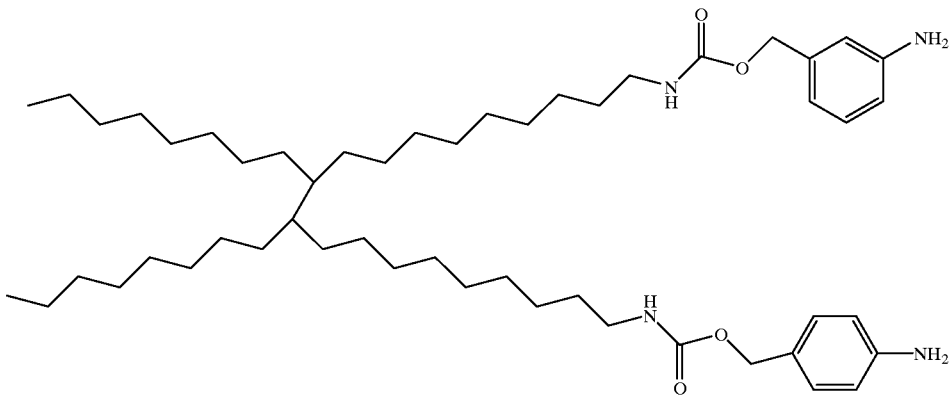

"Bis(m-aminobenzyl carbamate) of DDI 1410" (and cyclic isomers)

The diamine product of Example H (39.6 g, $4.32 \times 10^{-2}$ mols) and stannous chloride dihydrate (97.55 g, $4.32 \times 10^{-1}$ mols) were slurried in ethyl acetate (300 mL) in a 1 L three-necked flask equipped with mechanical stirrer and a reflux condensor under nitrogen. The reaction was heated to light reflux and stirred vigorously for 3 h. The solution was allowed to cool to room temperature and brought to pH 7–8 with a solution of saturated sodium bicarbonate. The mixture was pushed through a 25 micron filter to yield a mixture which separated into a cloudy aqueous layer and a moderately clear organic layer. The aqueous layer was isolated and washed with ethyl acetate (100 mL). The organic layers were combined, washed with distilled water (300 mL) and dried over anhydrous $MgSO_4$. The slurry was filtered and solvent removed from the filtrate in vacuo to yield yellow, sticky solid (33.8 g, 92%).

Example J

Preparation of "Bis(m-maleimidobenzyl carbamate) of DDI 1410"

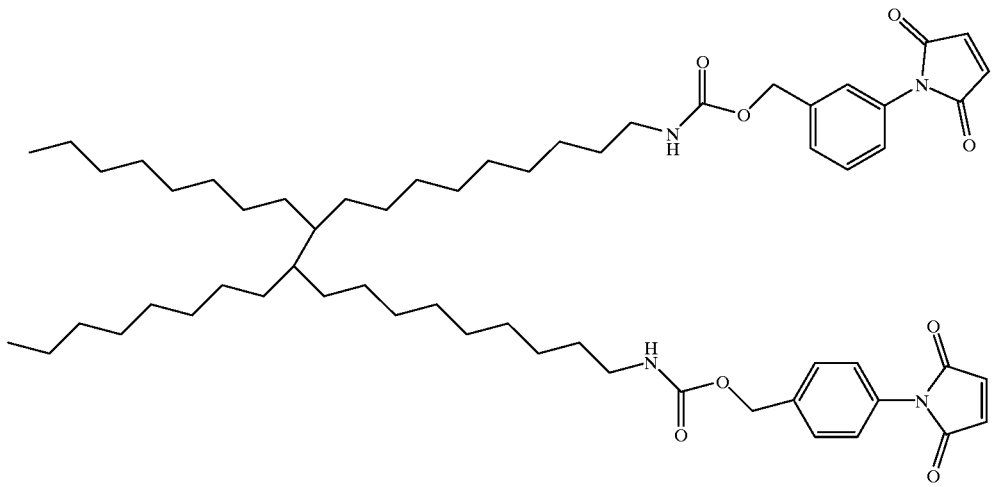

"Bis(m-maleimidobenzyl carbamate) of DDI 1410" (and cyclic isomers)

Maleic anhydride (15.4 g, $1.57 \times 10^{-2}$ mols) was dissolved in acetone (300 mL) in a 2 L four-necked flask equipped with mechanical stirrer, internal temperature probe and addition funnel under nitrogen. This solution was cooled to ~4° C. on an ice bath. A solution of the diamine prepared in Example (63.4 g, $7.48 \times 10^{-2}$ mols) in acetone (70 mL) was charged to the addition funnel and added to the maleic anhydride solution over a period of 30 minutes maintaining an internal temperature of <10° C. The resulting solution was stirred for 1 h and subsequently allowed to warm to room temperature and stir for 2 h.

To this solution of amic acid was added acetic anhydride (24.7 mL, $2.62 \times 10^{-1}$ mols), triethylamine (6.25 mL, $4.48 \times 10^{-2}$ mols) and manganese acetate tetrahydrate (0.37 g, $1.50 \times 10^{-3}$ mols). This solution was heated to light reflux for 6.5 h, then allowed to cool to room temperature. Bulk solvent was removed in vacuo, and the resulting dark liquid was dissolved in diethyl ether (500 mL). This solution was washed with dist. $H_2O$ (500 mL). The isolated organic layer was then washed with saturated $NaHCO_3$ aq. (500 mL) and again with dist. $H_2O$ (500 mL). The organics were isolated, dried over anhyd. $MgSO_4$, and solvent removed in vacuo to yield a viscous orange oil. This material exhibited FT-IR, $^1H$ NMR and $^{13}C$ NMR spectral features consistent with the expected bismaleimide product.

Example AA

Low Stress Dye Attach Adhesive Formulation and Die Shear Strengths on Various Leadframes A silver filled dye attach adhesive formulation having a viscosity of 9011 cPs (5 rpm, cone and plate) and thixotropic index of 5.36 was produced by combining the following at room temperature using a mechanical mixer:

| | |
|---|---|
| Liquid bismaleimide of Example B: | 2.644 g |
| Dimer divinyl ether of Example 5: | 2.644 g |
| Ricon 131MA20 (Ricon Resins, Inc.): | 0.661 g |
| Silquest A-174 (Witco Corp.): | 0.040 g |
| USP-90MD (Witco Corp.): | 0.099 |
| XD0026 (NSCC trade secret): | 0.119 |
| SF-96 silver flake | 23.794 |

The resulting paste was dispensed onto various metal leadframes as detailed below, and 120×120 mil silicon die were placed onto the adhesive bead to produce an approximately 1 mil bondline. Samples were "snap cured" at 200° C. for 60 seconds, and die shear strengths at room temperature and 240° C. were measured. These samples were then subjected to elevated temperature and humidity (85° C./85% RH) for 48 hours. Die shear strengths were then again measured at room temperature and 240° C. Results are tabulated in Table 1.

TABLE 1

Dye Shear Strengths (DSS) of Maleimide/Vinyl Ether Dye Attach Adhesive

| Cure Profile | No Moisture Exposure s/200° C. | | After Moisture Exposure (48 h/85° C./85 RH) 60 s/200° C. | |
|---|---|---|---|---|
| Test Temperature | 25° C. | 240° C. | 25° C. | 240° C. |
| Cu leadframe DSS (kg) | 4.88 ± 0.25 | 1.46 ± 0.35 | 6.54 ± 0.82 | 1.84 ± 0.76 |
| Ag—Cu leadframe DSS (kg) | 5.29 ± 0.34 | 2.17 ± 0.43 | 9.50 ± 1.88 | 1.56 ± 0.72 |
| Pd—Cu DSS (kg) | 5.52 ± 0.39 | 1.99 ± 0.44 | 11.9 ± 1.3 | 3.53 ± 0.66 |

Typical moisture uptake for these devices after saturation at 85° C./85% RH was 0.18 weight percent. Weight loss during cure was 0.16 ± 0.05 weight percent.

Example BB

HAST Testing of Maleimide/Vinyl Ether Dye Attach Adhesive

Similarly to Example AA, 120×120 mil dye were attached to leadframes of various compositions utilizing the adhesive composition given in Example AA. The bonded die were then cured using "snap cure" (60 s/200° C.) and "fast oven cure" conditions (15 min./175° C.). The resulting cured devices were subjected to simulated HAST testing conditions (130° C., 85% RH) for 130 hours. The devices exhibited good adhesion as measured by die shear strength (DSS) at both room temperature and elevated temperature as shown in Table 2.

TABLE 2

Dye Shear Strengths after simulated HAST Testing

| Cure Profile | 60 s/200° C. | | 15 minutes/175° C. | |
|---|---|---|---|---|
| Test Temperature | 25° C. | 240° C. | 25° C. | 240° C. |
| Cu leadframe DSS (kg) | 15.3 ± 1.8 | 1.12 ± 0.35 | 17.2 ± 0.8 | 1.25 ± 0.39 |
| Ag—Cu leadframe DSS (kg) | 16.3 ± 1.9 | 2.81 ± 0.55 | 14.8 ± 1.8 | 2.6 ± 1.6 |
| Pd—Cu DSS (kg) | 15.7 ± 1.7 | 3.04 ± 0.46 | 14.4 ± 0.7 | 2.96 ± 0.90 |

Example CC

Warpage of Large Dye Bonded with Maleimide/Vinyl Ether Dye Attach Adhesive

The die attach composition described in Example AA. was used to bond 500×500 mil die to Pd—Cu leadframes. The assembled pieces were "snap cured" and measured for die warpage at several temperatures and times. Typical results are given in Table 3. The performance exhibited by this adhesive qualifies it as a "low stress" material.

TABLE 3

Warpage of Maleimide/Vinyl Ether Die Attach Adhesive on 500 × 500 mil Die

| Thermal History | 1 min/200° C. | +1 min/240° C. | +4 h/175° C. |
|---|---|---|---|
| Warpage ($\mu$m) | 10.4 ± 1.3 | 11.9 ± 1.4 | 14.1 ± 1.6 |

Example DD

Thermal Analysis of Maleimide/Vinyl Ether Die Attach Adhesive

The composition of Example AA. was used to produce ~1 mil films using a drawdown bar. The films were "snap cured" (60 s, 200° C.) on a hot plate or oven cured (4 h/175° C.) and characterized by dynamic mechanical analysis (DMA). Results are summarized in Table 4.

TABLE 4

Thermal Analysis of Maleimide/Vinyl Ether Dye Attach Films

| Cure Profile | 60 s/200° C. | 4 h/175° C. |
|---|---|---|
| Tg (° C.) | −1 | 35 |
| Modulus (E') at −65° C. (psi) | 421,300 | 513,900 |
| Modulus (E') at 100° C. (psi) | 5,864 | 23,980 |

The materials exhibited moduli below $T_g$ typical of a low stress adhesive. The materials' moduli at temperatures above $T_g$ are sufficient to withstand typical wirebonding conditions without failure.

Example EE

Preparation of a siloxane bismaleimide

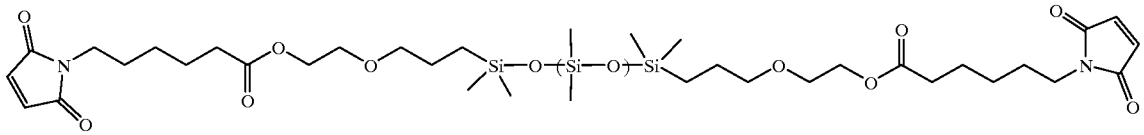

Carbinol-terminal siloxane (DMS-C15,Gelest Inc.; 27.26 g, 27.2 mmol) and N, N-dimethylaminopyridine (DMAP; 0.07 g, 0.55 mmol) were solvated in $CH_2Cl_2$ (200 mL) in a 500 mL four-necked flask equipped with mechanical stirring, addition funnel and internal temperature probe under nitrogen. This solution was cooled to ~5° C. on an ice bath. A solution of dicyclohexylcarbodiimide (DCC; 14.06 g, 68.1 mmol) in $CH_2Cl_2$ (50 mL) was charged into the addition funnel. This DCC solution was added to the siloxane/DMAP solution over the course of 45 minutes while maintaining an internal temperature of <10° C. This solution was stirred on the ice batch for two hours, at which point FT-IR analysis of an aliquot of the solution indicated the presence of ester (1740 $cm^{-1}$) and residual DCC (2120 $cm^{-1}$). The solution was allowed to warm to room temperature and stirred for an additional three hours. FT-IR analysis still indicated the presence of DCC. Acetic acid (20 mL) was added to the reaction and the solution was stirred for an additional one hour, at which point FT-IR indicated no residual DCC. The solution was filtered to remove precipitated dicyclohexylurea (DCU), and solvent was removed from the filtrate in vacuo. The remaining oil was re-solvated in heptane (200 mL) and cooled to ~5° C. for one week. The resulting solution was filtered from a precipitated reddish solid to yield a light brown solution. This solution was slurried with silica gel (10 g) for one hour at room temperature, filtered and solvent removed in vacuo to yield a light brown liquid which exhibited acceptable $^1H$ NMR, $^{29}Si$ NMR and FT-IR spectral features.

What is claimed is:

1. A curable adhesive composition for bonding an electronic component to a substrate comprising a maleimide compound and a curing initiator selected from the group consisting of a free-radical initiator, a photoinitiator, and a combination of those, the maleimide compound having the formula $(M—X_m)_n—Q$ in which n is 1 to 6, m is 1 or 2 and (a) M is a maleimide moiety having the structure:

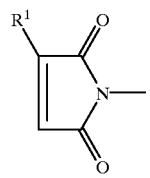

in which $R^1$ is H or an alkyl group having 1 to 5 carbon atoms;

(b) X is an aromatic group selected from the group of aromatic groups having the structures:

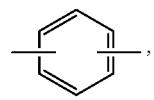
(I)

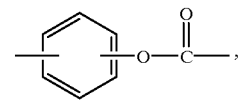
(II)

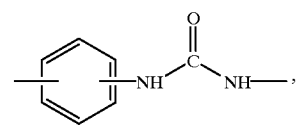
(III)

and

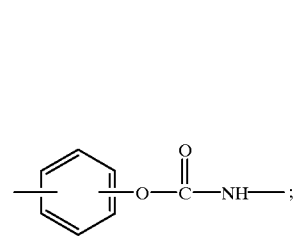
(IV)

and (c) Q is an ester having the structure:

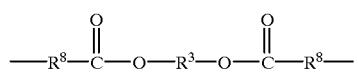

in which $R^3$ is a siloxane having the structure $—(CR^1{}_2)_g—(O)_{1,0}—(CR^1{}_2)_e—(Si—R^4{}_2—O)_f—Si—R^4{}_2—(CR^1{}_2)_g—(O)_{1,0}—(CR^1{}_2)_g—$ in which the $R^1$ substituent independently for each position is H or an alkyl group having 1 to 5 carbon atoms, $R^8$ is a linear or branched chain alkyl or alkylene oxy having 1 to 20 carbon atoms, $R^4$ substituent independently for each position is an alkyl group having 1 to 5 carbon atoms or an aryl group, e and g are independently 1 to 10, and f is 1 to 50.

2. A curable adhesive composition for bonding an electronic component to a substrate comprising a maleimide compound and a curing initiator selected from the group consisting of a free-radical initiator, a photoinitiator, and a combination of those, the maleimide compound having the formula $M_n—Q$ in which n is 1 to 6, and (a) M is a maleimide moiety having the structure:

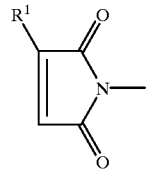

in which $R^1$ is H or an alkyl group having 1 to 5 carbon atoms;

(b) Q is an ester having the structure:

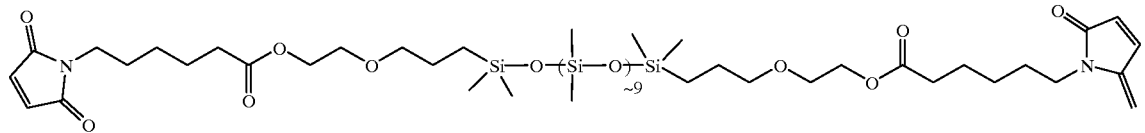

in which $R^3$ is a siloxane having the structure $—(CR^1{}_2)_g—(O)_{1,0}—(CR^1{}_2)_e—(Si—R^4{}_2—O)_f—Si—R^4{}_2—(CR^1{}_2)_g—(O)_{1,0}—(CR^1{}_2)_g—$ in which the $R^1$ substituent independently for each position is H or an alkyl group having 1 to 5 carbon atoms, $R^8$ is a linear or branched chain alkyl or alkylene oxy having 1 to 20 carbon atoms, $R^4$ substituent independently for each position is an alkyl group having 1 to 5 carbon atoms or an aryl group, e and g are independently 1 to 10, and f is 1 to 50.

3. A curable adhesive composition according to claim 2 in which the maleimide compound has the formula

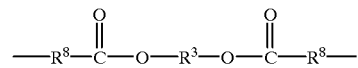

4. An electronic assembly comprising an electronic component bonded to a substrate with a cured adhesive composition prepared from a composition according to any one of the preceding claims.

* * * * *